US012599007B2

(12) United States Patent
    Mallik et al.

(10) Patent No.: US 12,599,007 B2
(45) Date of Patent: Apr. 7, 2026

(54) COMPOSITE IC DIE PACKAGE INCLUDING AN ELECTRO-THERMO-MECHANICAL DIE (ETMD) WITH THROUGH SUBSTRATE VIAS

(71) Applicant: Intel Corporation, Santa Clara, CA (US)

(72) Inventors: Debendra Mallik, Chandler, AZ (US); Omkar Karhade, Chandler, AZ (US); Nitin Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 881 days.

(21) Appl. No.: 17/560,609

(22) Filed: Dec. 23, 2021

(65) Prior Publication Data

US 2023/0207471 A1      Jun. 29, 2023

(51) Int. Cl.

| | |
|---|---|
| *H01L 23/538* | (2006.01) |
| *H01L 23/00* | (2006.01) |
| *H01L 23/48* | (2006.01) |
| *H01L 25/00* | (2006.01) |
| *H01L 25/065* | (2023.01) |

(52) U.S. Cl.
CPC ........ *H01L 23/5383* (2013.01); *H01L 23/481* (2013.01); *H01L 24/08* (2013.01); *H01L 24/80* (2013.01); *H01L 25/0655* (2013.01); *H01L 25/50* (2013.01); *H01L 24/13* (2013.01); *H01L*

*24/16* (2013.01); *H01L 2224/08235* (2013.01); *H01L 2224/16225* (2013.01); *H01L 2224/80815* (2013.01)

(58) Field of Classification Search
None
See application file for complete search history.

(56) References Cited

U.S. PATENT DOCUMENTS

| | | | |
|---|---|---|---|
| 2014/0147972 A1* | 5/2014 | Semmelmeyer ..... | H05K 1/0201 438/109 |
| 2015/0216030 A1* | 7/2015 | Semmelmeyer .... | H01L 25/0652 29/829 |
| 2020/0098692 A1* | 3/2020 | Liff ..................... | H01L 23/5386 |
| 2020/0273840 A1* | 8/2020 | Elsherbini .............. | H01L 24/17 |
| 2021/0111154 A1* | 4/2021 | Elsherbini ........... | H01L 25/0652 |
| 2022/0415808 A1* | 12/2022 | Chava ................. | H01L 25/0655 |

* cited by examiner

*Primary Examiner* — Long Pham
(74) *Attorney, Agent, or Firm* — Essential Patents Group, LLP

(57)      ABSTRACT
Multi-die composite packages including directly bonded IC die and at least one electro-thermo-mechanical die (ETMD). An ETMD is distinguished from an active IC die as an ETMD is a passive die lacking any semiconductor devices, such as transistors. In exemplary embodiments, an ETMD includes a substrate, which may be a crystalline semiconductor material, for example, and one or more through substrate vias (TSVs) passing through a thickness of the substrate. The TSVs may enable a ETMD to electrically interconnect an (active) IC die of a composite package to another IC die of the package or to a package host.

16 Claims, 8 Drawing Sheets

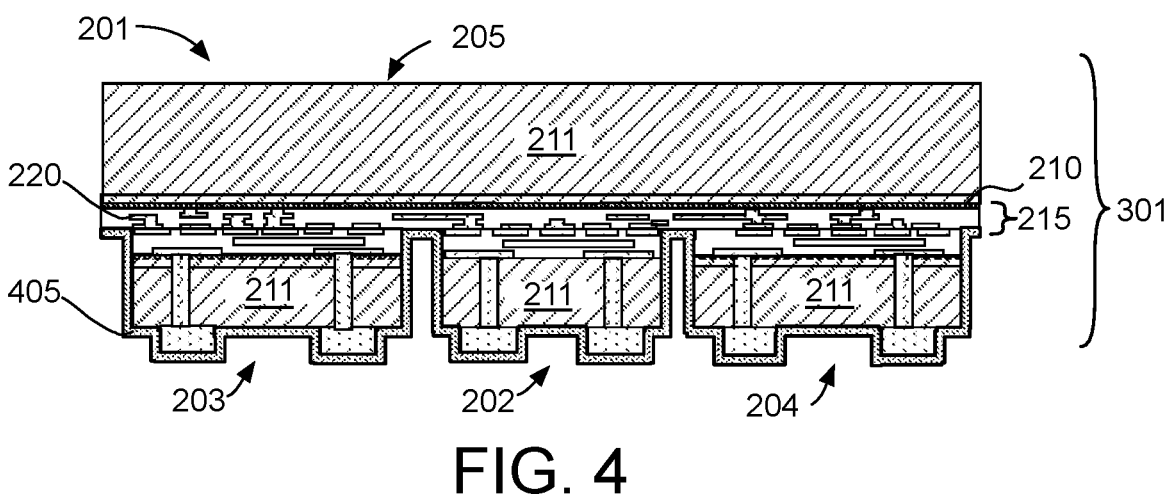
FIG. 4
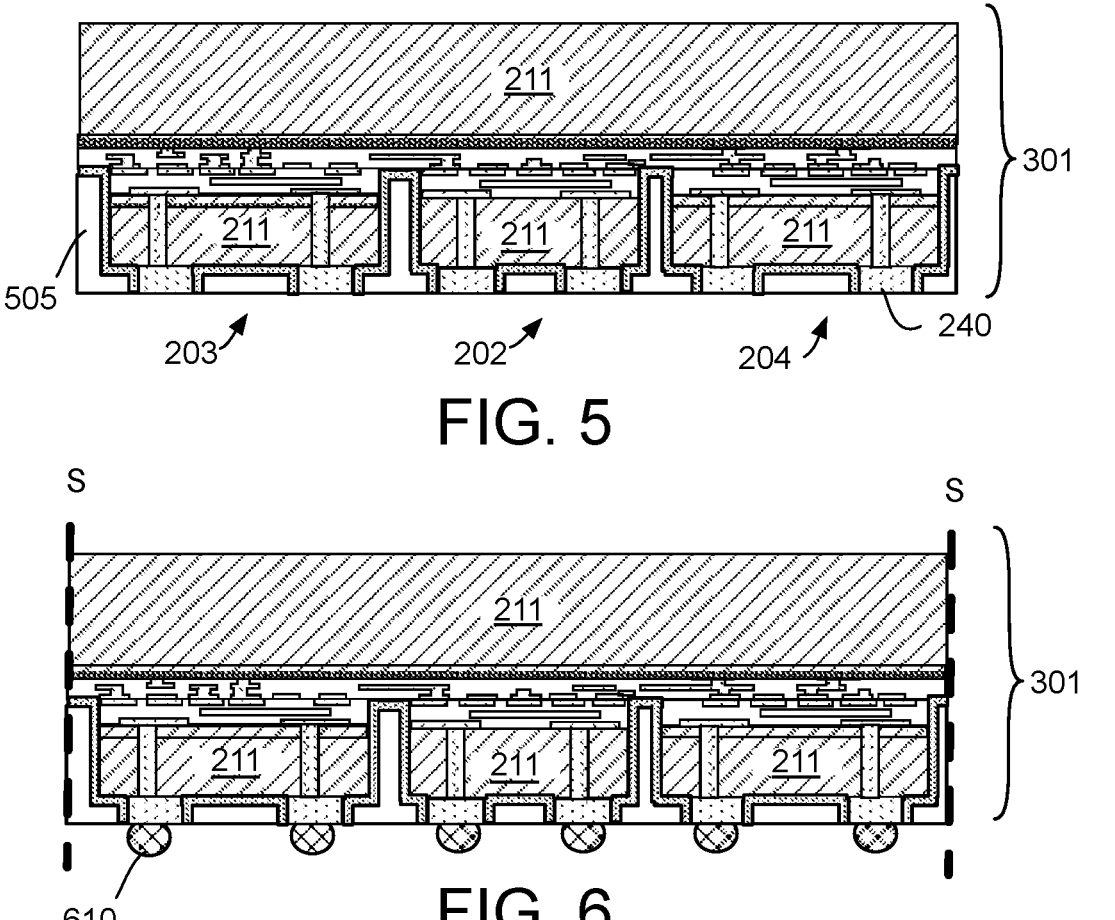
FIG. 5
FIG. 6

700

750

201

301

610

705

720

COMPOSITE IC DIE PACKAGE INCLUDING AN ELECTRO-THERMO-MECHANICAL DIE (ETMD) WITH THROUGH SUBSTRATE VIAS

BACKGROUND

Monolithic integrated circuit (IC) fabrication has restrictions that may limit a final product's performance, and thus different versions of IC die (dis)integration are being investigated. To date however, these techniques and architectures generally suffer from certain drawbacks such as high cost, lower insertion efficiency, and increased z-height.

IC die disintegration techniques rely on advances in multi-die integration at the package level. In electronics manufacturing, IC packaging is a stage of semiconductor device fabrication in which an IC that has been monolithically fabricated on a chip (or die) comprising a semiconducting material is assembled into a "package" that can protect the IC chip from physical damage and support electrical contacts that connect the IC to a scaled host component, such as an organic package substrate, or a printed circuit board. Multiple chips can be similarly assembled together, for example, into a multi-chip package (MCP).

Multi-chip packages may advantageously combine IC chips from heterogeneous silicon processes and/or combine small dis-aggregated chips from identical silicon processes. However, there are many challenges with integrating multiple IC die into such a chip-scale unit. For example, upper-level die within a die stack can be difficult to electrically interconnect to an underlying host interface because of an intervening lower-level die. Conventionally, interconnects to an upper-level die are fabricated through a package insulator within a region adjacent to the lower-level die. For example, through mold vias (TMV), or more generally through dielectric vias (TDV), may be formed through a package insulator material adjacent to a lower-level die. TDVs however complicate package fabrication and thermal conductivity of the package insulator can be relatively poor.

Accordingly, alternative multi-die composite IC die package architectures, and assembly techniques associated with those package architectures, that are capable of interconnecting upper-level die with a package host interface are commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 4 illustrates a cross-sectional view of the composite IC die package shown in FIG. 3 following deposition of a moisture seal, in accordance with some embodiments;

FIG. 5 illustrates a cross-sectional view of the composite IC die package illustrated in FIG. 4 following a package insulator molding process, in accordance with some embodiments;

FIG. 6 illustrates a cross-sectional view of the composite IC die package illustrated in FIG. 5 following formation of package first-level interconnect (FLI) features and package singulation, in accordance with some embodiments;

DETAILED DESCRIPTION OF EXEMPLARY EMBODIMENTS

Figure 1:
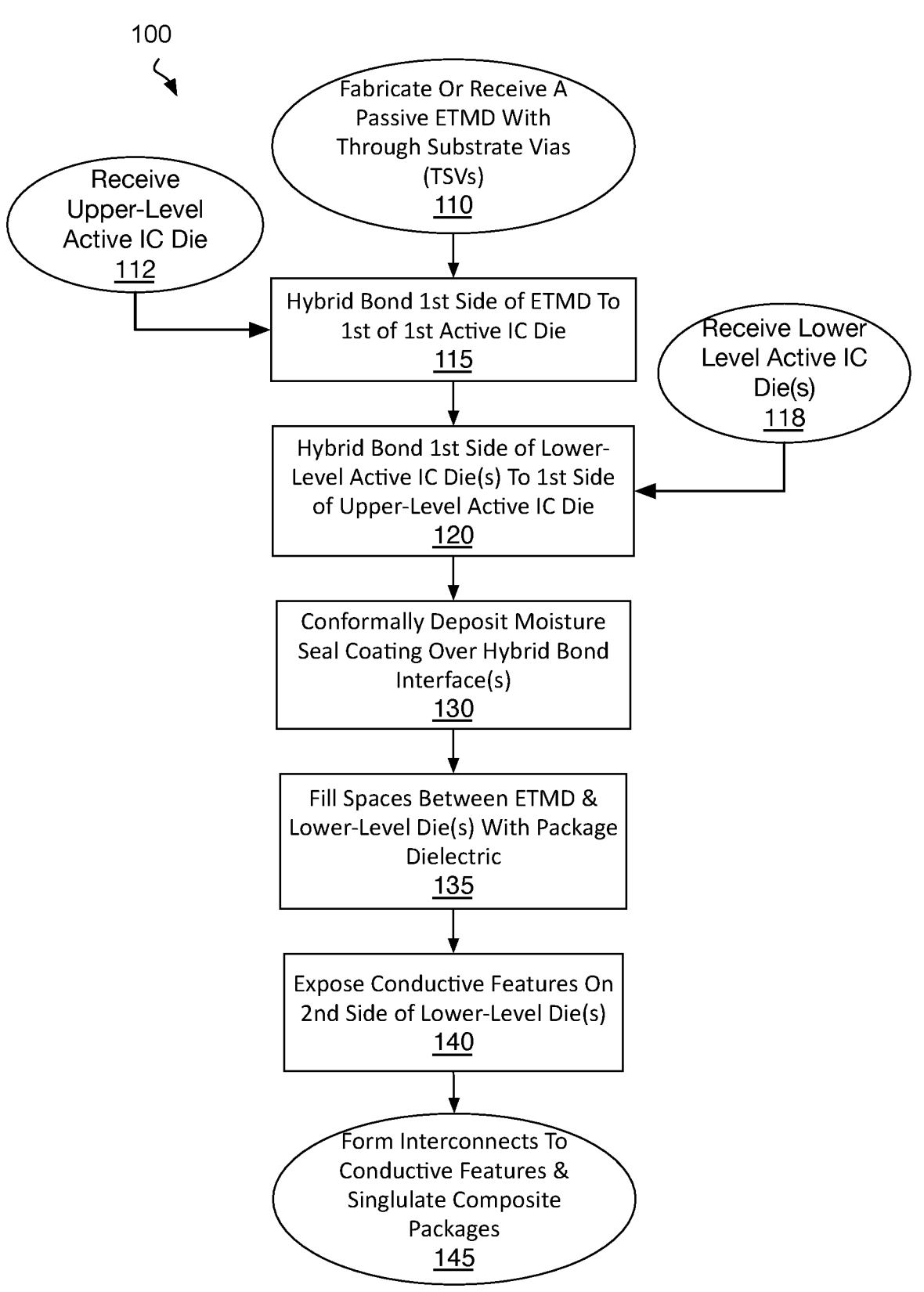
FIG. 1 illustrates a flow diagram of methods for assembling a composite multi-die package including an electro-thermo-mechanical die (ETMD), in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

Multi-die composite packages including directly bonded IC die are described herein. The package is referred to as a "composite" because at least some of the die are directly bonded to each other rather than being interconnected with a joining material, such as solder. The composite IC die package examples described include at least one electro-thermo-mechanical die (ETMD). An ETMD is distinguished from an active IC die as an ETMD lacks any semiconductor devices, such as transistors. Although purely passive, an ETMD includes electrical interconnects that pass through the thickness of the die. In exemplary embodiments, an ETMD includes a substrate, which may be a crystalline semiconductor material, for example, and one or more through substrate vias (TSVs) pass through a thickness of the substrate. The TSVs enable a ETMD to electrically interconnect an (active) IC die of a composite package to another IC die of the package or to a package host.

A substrate material of an ETMD may be selected to have a bulk thermal conductivity that exceeds typical organic and inorganic dielectric materials. ETMD in accordance with some embodiments herein may also improve thermal interconnection between an (active) IC die of a composite package and another IC die of the package, or a package host. The substrate material of an ETMD may also be selected to have good mechanical properties that are well-matched to those of (active) IC die. For example, an ETMD may have a bulk coefficient of thermal expansion (CTE) that is substantially the same as that of an (active) IC die. An ETMD may therefore improve mechanical interconnection of an IC die to another IC die of the package, or to a package host.

With electrically conductive features fabricated into an ETMD, die bonding techniques may be employed to bond metal features embedded within an insulator of an IC die to those of the ETMD. Where both the metal features and the insulators of the ETMD and IC die are fused, the resultant composite structure comprises a hybrid bonded interface of both metallurgically interdiffused metals and chemically bonded insulators. Prior to bonding, each (active) IC die and ETMD may be fabricated in a monolithic process separate from each other. As such, an ETMD and each IC die may be fabricated with the same or different wafer fab technologies. Likewise, prior to assembly, each IC die may be fabricated to support face-to-face, face-to-back, or back-to-back bonding with another IC die.

A number of different assembly and/or fabrication methods may be practiced to form a composite IC die package having one or more of the features or attributes described herein. FIG. 1 illustrates a flow diagram of methods 100 for assembling a composite IC die package including an ETMD, in accordance with some exemplary embodiments. Methods 100 begin at input 110, where an ETMD is fabricated, or received as a preform that has been fabricated upstream of methods 100. A plurality of such ETMDs may be fabricated monolithically from a substrate, such as a glass or silicon (e.g., monocrystalline) starting wafer, for example. Any IC die fabrication process that includes formation of through-substrate vias may be modified to fabricate an ETMD, for example by removing front-end-of-line operations directed at forming transistors.

Methods 100 continue at block 115 where a first side of the ETMD is hybrid bonded to a first side of an (active) IC die received at input 112. The IC die received at input 112 is referred to herein as an "upper-level" die as it will be separated from a package host by at least the ETMD. In some embodiments, block 115 entails "face-to-face" hybrid bonding where features on a front-side of the upper-level IC die are bonded to features on a front-side of the ETMD. In alternative embodiments, block 115 entails "face-to-back" or "back-to-face" hybrid bonding where features on a back-side of the upper-level IC die are bonded to features on a front-side of the ETMD.

Methods 100 continue at block 120 where the first side of the upper-level IC die is further bonded to a first side of another (active) IC die received at input 118. The IC die received at input 118 is referred to herein as an "lower-level" die as it is to be positioned between the upper-level die and any suitable package host. In some embodiments, block 120 entails "face-to-face" hybrid bonding where features on a front-side of the upper-level IC die are bonded to features on a front-side of the lower-level IC die. In alternative embodiments, block 120 entails "face-to-back" or "back-to-face" hybrid bonding where features on a back-side of the lower-level IC die are bonded to features on a front-side of the upper-level die. In still other embodiments, for example where the ETMD and upper-level die are in a "face-to-back" or "back-to-face" configuration, a "back-to-back" hybrid bonding process may be performed at block 120.

Figure 2:
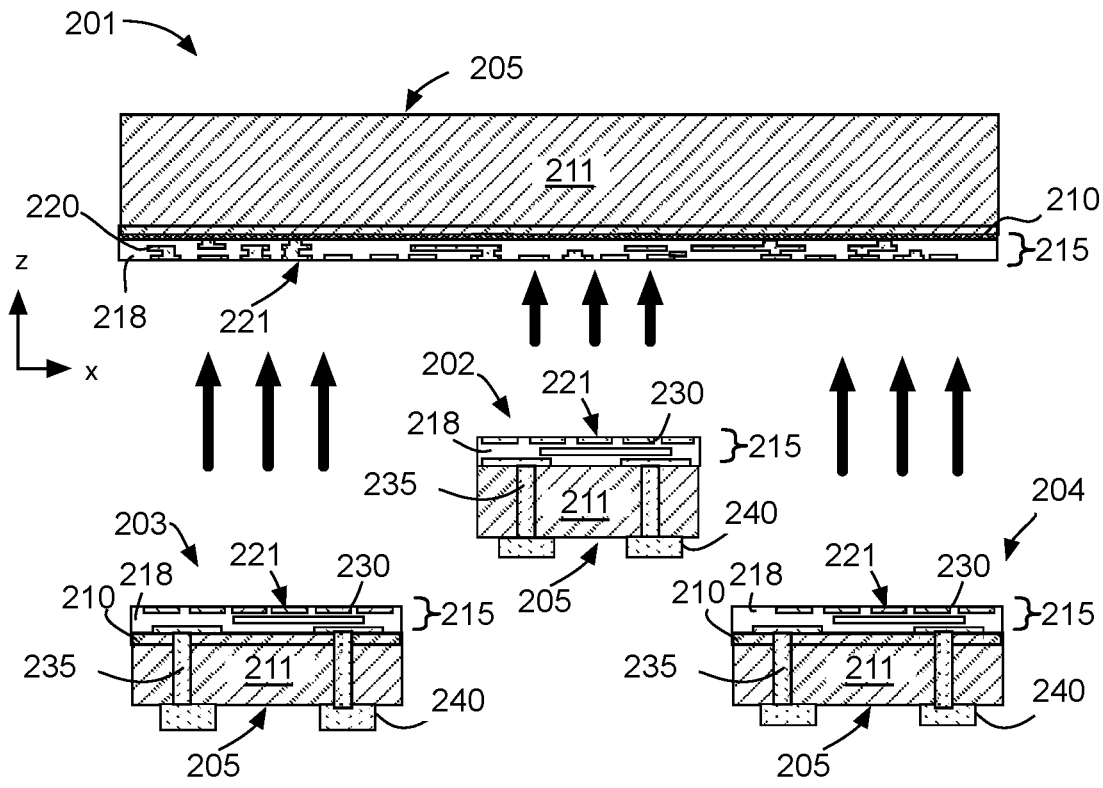
FIG. 2 illustrates cross-sectional views of active IC die and an ETMD arranged for bonding into a composite IC die package, in accordance with some embodiments.

FIG. 2 is a cross-sectional illustration of an upper-level IC die 201, an ETMD 202, and two lower-level IC die 203 and 204 being aligned for bonding into a composite IC die package, in accordance with some embodiments. Although only one IC die 201 is illustrated, IC die 201 may be one of multiple such IC die in a monolithic wafer or a reconstituted panel suitable for wafer-level or panel-level assembly. As shown, IC die 200 has a back side 205 comprising a substrate material 211. In some examples, substrate material 211 is silicon. In other examples, substrate material 211 is an alternative crystalline material, such as, but not limited to, germanium, $Si_xGe_{1-x}$, $Ge_xSn_{1-x}$ or silicon carbide. In still other examples, substrate material 211 is glass, which can have flatness approximately equal to that of crystalline substrates, but at a lower cost.

In exemplary embodiments, IC die 201 is "active" and includes a device layer 210 fabricated in, or on, substrate material 211. Device layer 210 may be homogenous with substrate material 211, or not (e.g., a transferred substrate). IC die device layer 210 (and a homogeneous IC die substrate material 211) may include any semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, IC device layer 210 is a Group III-V material comprising a Group III majority constituent and a Group IV majority constituent (e.g., InGaAs, GaAs, GaSb, InGaSb). IC device layer 210 may have a thickness of 100-1000 nm, for example. IC die device layer 210 need not be a continuous layer of semiconductor material, but rather may include active regions of semiconductor material surrounded by field regions of isolation dielectric.

In some embodiments, the active devices within device layer 210 are field effect transistors (FETs) with a device pitch of 80 nm, or less. The FETs may be of any architecture (e.g., planar, non-planar, single-gate, multi-gate, stacked nanosheet, etc.). In some embodiments, FET terminals have a feature pitch of 20-40 nm. Additionally, or in the alternative, IC die device layer 210 may include active devices other than FETs. For example, IC die device layer 210 may include electronic memory structures, such as magnetic tunnel junctions (MTJs), capacitors, or the like.

In alternative embodiments, IC die 201 is "passive" without any device layer 210 and lacking any transistors. Regardless of whether IC die 201 is active or passive, IC die 201 may include passive devices such as resistors, capacitors, or inductors (not depicted).

IC die 201 has a front side 221 that comprises one or more back-end-of-line (BEOL) metallization levels 215. In exemplary embodiments, metallization levels 215 include metallization features 220 embedded within an insulator 218. While metallization features 220 may have any composition (s) of sufficient electrical conductivity, in exemplary embodiments, metallization features 220 are predominantly copper (Cu). In other examples, metallization features 220 are predominantly other than Cu, such as, but not limited to predominantly Ru, or predominantly W. An uppermost one of metallization levels 215 includes "bondable" metallization features 220 that have an associated feature pitch suitable for directly bonding to complementary conductive features of another die. This feature pitch may range from 100 nm to several microns, for example.

Insulator 218 may similarly have any composition(s) suitable as an electrical insulator. In exemplary embodiments, insulator 218 is an inorganic interlayer dielectric (ILD) material having any material composition known to be suitable as an insulator of monolithic integrated circuitry, such as, but not limited to, silicon dioxide, silicon nitride, silicon oxynitride, or a low-k material having a relative permittivity below 3.5. In some embodiments, ILD materials between metallization levels 215 vary in composition with a lower ILD material layer comprising a low-k dielectric material and an uppermost ILD material layer comprising a conventional dielectric material (e.g., having a dielectric constant of approximately 3.5, or more). Confining low-k dielectric materials distal from a bond interface in this manner may advantageously improve bond strength and/or quality. In other embodiments where low-k dielectric material is able to form a strong bond interface, all ILD material layers of insulator 218 may all be a low-k material (e.g., having a relative permittivity of 1.5-3.0).

As further illustrated in FIG. 2, ETMD 202 similarly includes a substrate material 211, which may be any of the materials described above and in some exemplary embodiments has the same composition as the substrate of IC die 201. ETMD 202 also includes BEOL metallization levels 215 embedded in insulator 218, for example substantially as described above for IC die 201. BEOL metallization levels 215 terminate at bondable metallization features 230, which have an associated feature pitch suitable for directly bonding to complementary conductive features of IC die 201. This feature pitch may range from 100 nm to several microns, for example.

ETMD 202 lacks any device layer. Instead of coupling to devices (e.g., transistors) of a device layer, BEOL metallization levels 215 of ETMD 202 instead couple to through-substrate vias (TSVs) 235. TSVs 235 extend through the thickness of substrate material 211 from a bondable metal feature 230 to an opposite (e.g., back) side 205 of ETMD 202. For embodiments where substrate material 211 of ETMD 202 is glass, TSVs 235 may be more specifically referred to as through-glass vias (TGVs). TSVs 235 may comprise any material of sufficient electrical conductivity, and may be, for example, predominantly Cu. Each TSV 235 is electrically coupled with one or more metallization features of metallization levels 215.

In the illustrated embodiment, TSVs 235 terminate at interconnect interfaces 240 that extend from back side 205. Hence, in contrast to the bondable metallization features 230, which are embedded within insulator 218, interconnect interfaces 240 are pillars that extend a height from substrate material 211. Interconnect interfaces 240 may be fabricated according to a semi-additive process (SAP), for example with Cu electroplated within a plating mask, and the plating mask removed following the plating. However, other metallizations are also possible.

Along with ETMD 202, one or more active IC dies are to be similarly hybrid bonded as lower-level die. FIG. 2 illustrates two lower-level IC die 203 and 204. Each of IC dies 203 and 204 may have any dimensions and any functionality. The IC die received at input 112 may be fully functional ASICs, or may be chiplets or tiles that have a more limited functionality supplementing the function of one or more other IC die. A chiplet or tile may, for example, be any of a wireless radio circuit, microprocessor core, electronic memory circuit, floating point gate array (FPGA), power management and/or power supply circuit, or include a MEMS device. In some other examples, IC die 203 or 204 includes one or more banks of active repeater circuitry to improve multi-chip package interconnects (e.g., network-on-chip architectures). A repeater bank may, for example, support 2000+ signals within an IC die area of 0.4 mm². In other examples, IC die 203 or 204 includes clock generator circuitry or temperature sensing circuitry. In other examples, IC die 203 or 204 includes one or more ESD banks. In still other examples, IC die 203 or 204 includes logic circuitry that, along with upper-level IC die 201 implements 3D logic circuitry (e.g., mesh network-on-chip architectures).

As shown in FIG. 2, IC dies 203 and 204 each include a device layer 210 over substrate material 211, and BEOL metallization levels 215 on the front side 221. Device layer 210, substrate material 211 and metallization levels 215 may have any of the properties described above for upper-level IC die 201. In the illustrated assembly, front side 221 of IC dies 203 and 204 are to bond with front side 221 in a face-to-face configuration. IC dies 203 and 204 further include TSVs 235 extending through substrate material 211 and interconnecting BEOL metallization levels 215 to interconnect interfaces 240 on back side The arrows in FIG. 2 represent alignment of bondable metal features on the first side of upper-level IC die 101 to corresponding metal features on the first side of ETMD 202 and lower-level IC dies 203, 204. The feature pitch at the bond interface accommodates alignment imprecision. The feature pitch of the metal features on the IC die and ETMD may therefore be predetermined based on alignment capabilities of a particular bonder.

Figure 3:
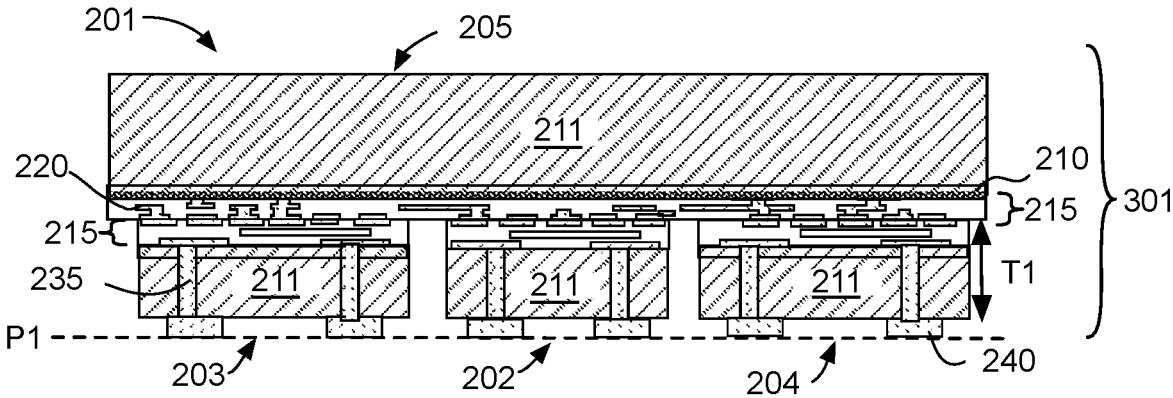
FIG. 3 illustrates a cross-sectional view of a composite IC die package following hybrid bonding of the die illustrated in FIG. 2, in accordance with some embodiments.

FIG. 3 illustrates a cross-sectional view of a composite IC die package 301 following hybrid bonding of upper-level IC die 201 to each of ETMD 202, lower-level IC die 203, and IC die 204. Hybrid bonding surfaces of die 201-204 are substantially co-planar. ETMD 202 has a predetermined thickness T1 that is substantially equal to that of lower-level IC die 203, 204. Although thickness T1 may vary with implementation, in some exemplary embodiments, thickness T1 is between 50 and 200 μm. Interconnect interfaces 240 for each of ETMD 202 and IC die 203, 204 are therefore all substantially co-planar along plane P1. Within IC die package 301, ETMD 202 may convey electrical signals and/or power received at interconnect interfaces 240 to BEOL metallization levels 215 and device layer 210 of IC die 201. In the example illustrated, each of lower-level IC die 203 and 204 are also coupled to receive signals and/or power through interconnect interfaces 240. However, the electrical signals and/or power conveyed by ETMD 202 may also be routed into either (or both) of IC die 203 and 204.

Composite IC die package 301 may result from any alignment and bonding process suitable for the IC die and ETMD. For example, an IC die of a relative large edge size may be handled and aligned to a target location on the host IC wafer according to pick-and-place die assembly methods and systems. Many such methods and systems can handle an object as thin as 100 μm and with edge lengths ranging from tens of millimeters down to ~200 μm. Die attachment may also comprise one or more micro device assembly techniques including so-called transfer printing methods, which are capable of handling an object as thin as 1 μm and having lateral dimensions in the tens of micrometers. Such micro device assembly techniques may rely on a MEMS microtool that includes hundreds or even thousands of die attachment points. Micro device assembly methods and systems suitable for inorganic LED (iLED) technology, for example, may be employed to transfer a plurality of IC chiplets concurrently from a source IC die substrate to multiple interposers arrayed within a wafer or panel. The same techniques may be practiced to bond ETMD 202.

IC dies 203, 204 and ETMD 202 may be aligned to a target location on IC die 201 with any high-resolution alignment tool, for example of the type found on a wafer-level or chip-level bonding tool commercially available through EVG, SUSS, or TEL. Alignment capability continues to advance, having improved from +/−5 μm to +/−0.2 μm over recent years. Once adequately aligned, any direct bonding technique(s) suitable for the die and interfaces may be practiced. Direct bonding of IC die 201 to each of ETMD 202 and IC die 203, 204 may be metal-to-metal, for example, during which metallization features sinter. In some embodiments, a hybrid bond is formed between both between metallization features (e.g., via metal interdiffusion) and between dielectric materials (e.g., via Si—O—Si condensation bonds). Thermo-compression bonding may be at low temperature (e.g., below melting temperature of the interconnects, and more specifically below 100° C.). Direct bonding at room temperature (i.e., compression only) is also possible. Prior to bonding, any of ETMD 202 or IC die 201, 203, 204 may be pre-processed, for example with a plasma clean, to activate their surfaces for the bonding. Post bonding, selective heating may be performed to make permanent the bond (e.g., by converting a van der waals bond into a sintered Cu—Cu bond through interdiffusion). For selective heating, a laser may be employed to limit heating to ETMD 200 or a specific one IC die 203, 204.

In some embodiments, lateral (e.g., x-axis) misalignment or misregistration between conductive features of IC die 201 and ETMD 202 (and/or IC die 203, 204) is less than 0.2 μm. For example, lateral misalignment between one conductive feature (e.g., a line or trace) and another conductive feature (e.g., a via) within a monolithic IC die may be at least an order of magnitude smaller than the lateral misalignment between bonded conductive features. The lateral dimensions of metallization features at the bond interface are sufficiently large to accommodate such lateral offset. Where multiple die (e.g., ETMD 202 and IC die 203 and 204) are bonded individually to IC die 201, the magnitude of the lateral offset may vary between die.

Returning to FIG. 1, methods 100 continue with further processing of the composite IC die package. Optionally, a moisture seal coating is deposited over the bond interface at block 130. The seal coating is advantageously conformally deposited, for example by chemical vapor deposition (CVD) or plasma enhanced CVD (PECVD). As the seal coating is to hermetically seal the bond interface, the thickness of the seal coating may vary with composition. FIG. 4 illustrates a cross-sectional view of the composite IC die package 301 following a substantially conformal deposition of a moisture seal 405, in accordance with some embodiments. Although composition may vary with implementation, in exemplary embodiments moisture seal 405 is an inorganic dielectric material comprising nitrogen. In one example, moisture seal 405 is silicon nitride. As shown, moisture seal 405 is in contact with front side of IC die 201, and more specifically in contact with regions of the bond interface on IC die 201 that are not bonded to ETMD 202 or IC die 203, 204. Moisture seal 405 is also in contact with a sidewall of ETMD 202 and IC die 203, 204.

Returning to FIG. 1, methods 100 continue at block 135 where spaces or cavities between the ETMD and lower-level IC die is filled with a package insulator that may be either an inorganic or organic material. The package insulator may be applied, for example, with a molding process or with a dry film lamination process. Subsequently, conductive features on a second side of the lower-level IC die are exposed at block 140.

FIG. 5 illustrates a cross-sectional view of the composite IC die package 301 following molding of a package insulator 505, in accordance with some embodiments. As shown, package insulator 505 substantially fills spaces and/or cavities between ETMD 202 and lower-level IC die 203, 204. In exemplary embodiments package insulator 505 is an organic material, such as an epoxy with one or more fillers. In other embodiments, package insulator 505 is an inorganic dielectric material, for example comprising predominantly silicon and oxygen. In the illustrated example, a grind, polish, or other planarization process has been performed to remove any overburden of the molding process. The grind process also removes moisture seal 405, exposing a surface of conductive interconnect interfaces 240.

Returning to FIG. 1, methods 100 are completed at output 145 where first level interconnects (FLI) are formed on exposed surfaces of conductive features of the composite IC die package in preparation for a next level of assembly. In exemplary embodiments, solder features are formed as the FLI. The composite IC die package may then be singulated according to any techniques known to be suitable for stacked die packages. FIG. 6 illustrates a cross-sectional view of composite IC die package 301 following formation of package FLI features 610 and package singulation along dashed lines S. In exemplary embodiments, FLI features 610 are solder (e.g., SAC) microbumps although other interconnect features are also possible.

Figure 7:
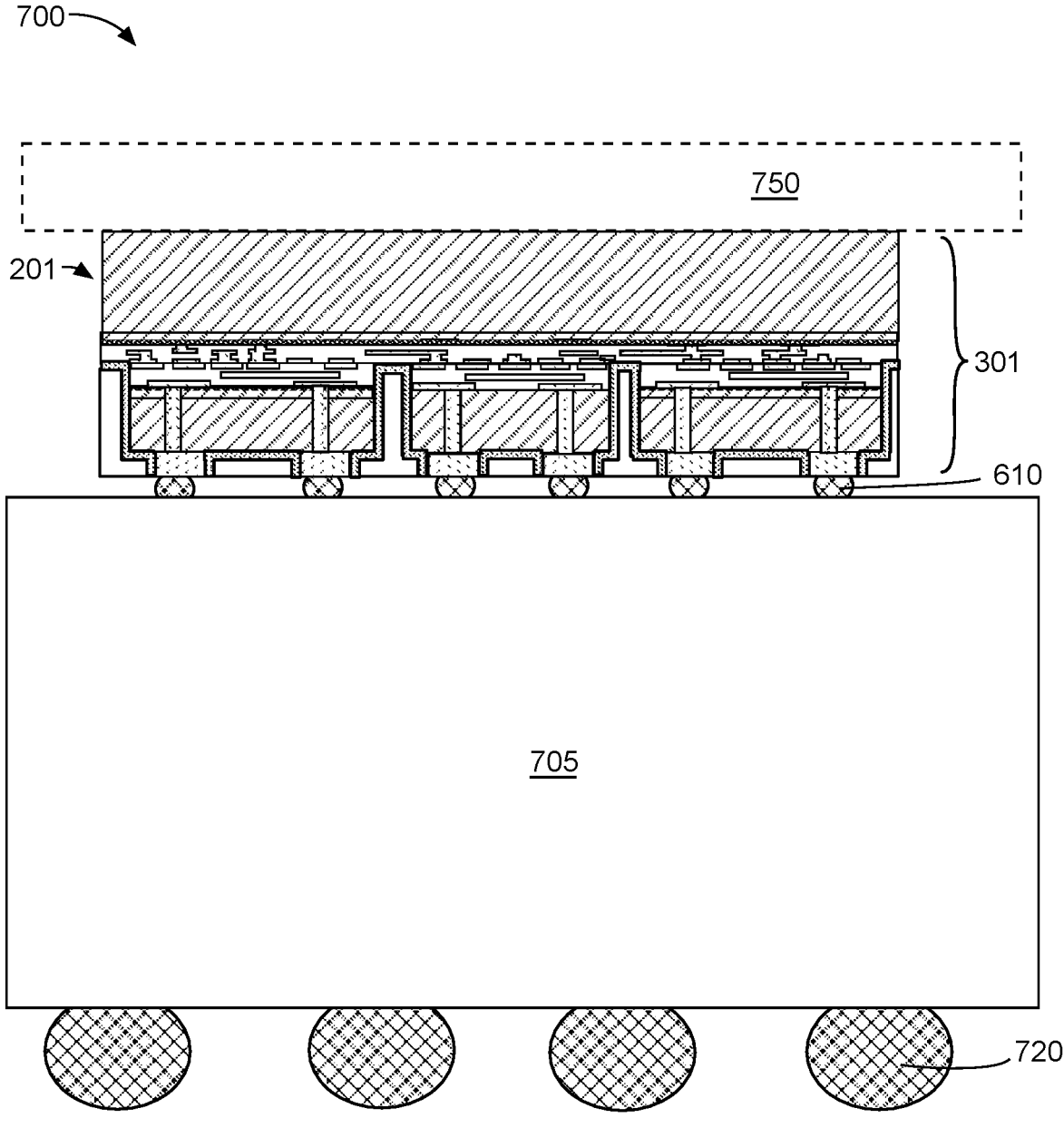
FIG. 7 illustrates a system including the composite IC die package illustrated in FIG. 6 attached to a host component with FLI features, in accordance with some embodiments.
Figure 8A:
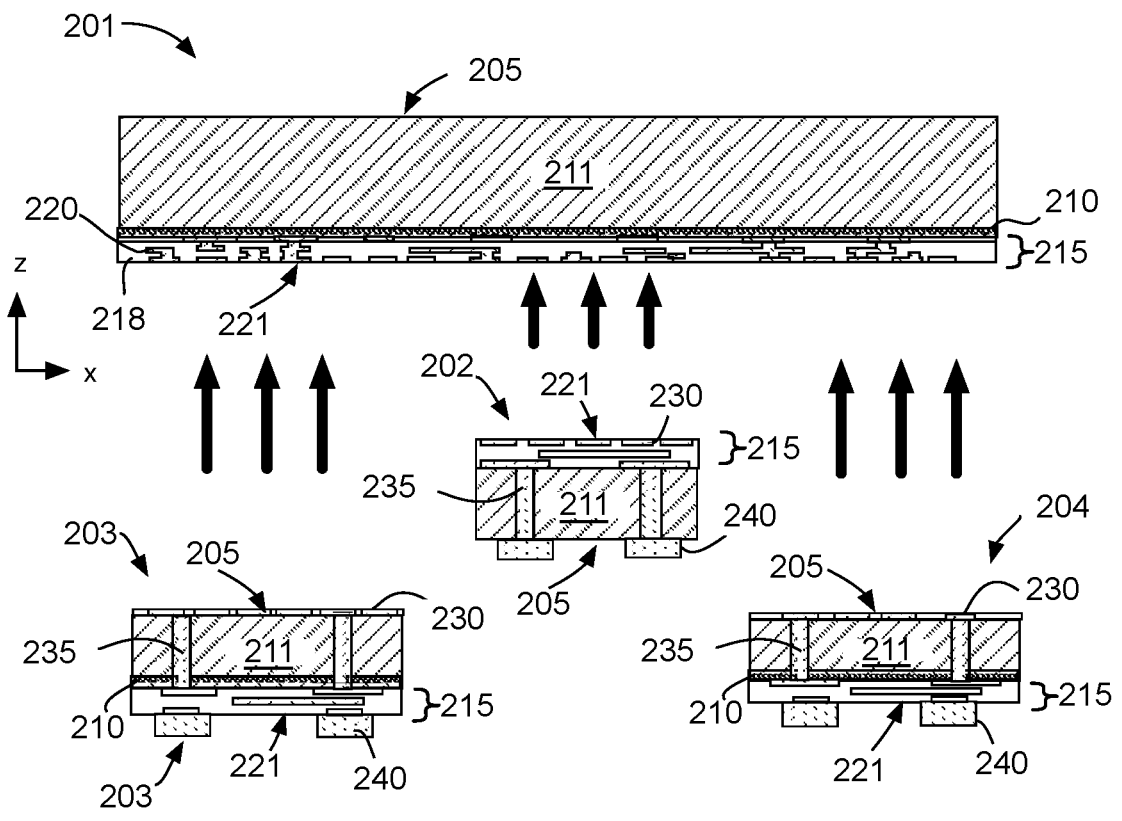
FIGS. 8A and 8B illustrate cross-sectional views of hybrid bonding active IC die and ETMD into a composite IC die package, in accordance with some alternative embodiments.
Figure 8B:
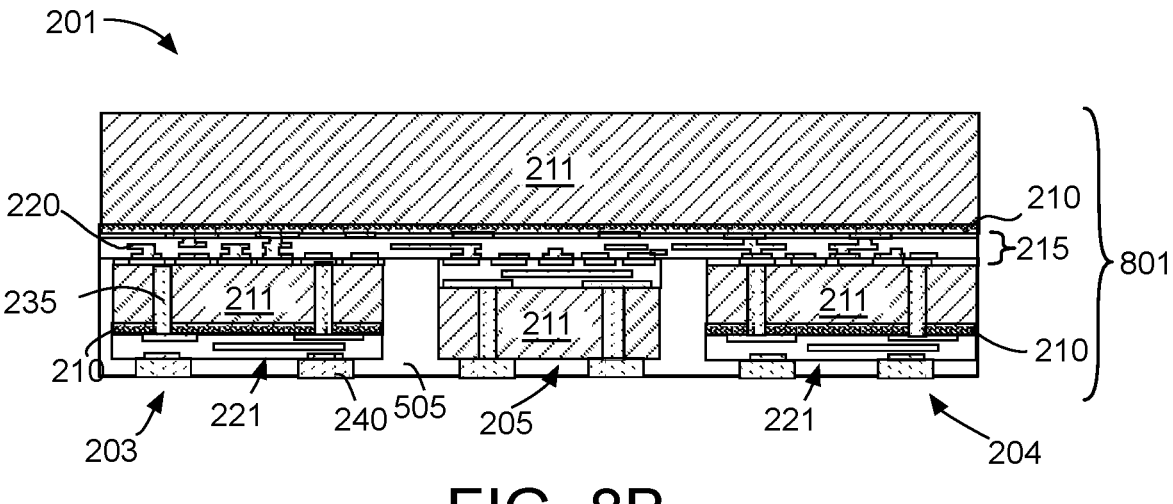

FIG. 7 illustrates a system including the composite IC die package 301 attached to a host component 705 by reflowing FLI features 610. In some embodiments, host component 705 is predominantly silicon. Host component 705 may also comprise one or more alternative materials known to be suitable as interposers or package substrates (e.g., an epoxy preform, cored or coreless laminate board, etc.). Host component 705 may include one or more metallized redistribution levels (not depicted) embedded within a dielectric material. Host component 705 may also include one or more IC die embedded therein. For example, an IC interconnect bridge (not depicted) may be embedded within metallized redistribution levels of host component 705, for example to electrically couple composite IC die package 301 to another IC, such as a memory IC die (not depicted) or another composite IC die package (not depicted).

As further shown in FIG. 7, host component 705 (e.g., a package substrate) may be further coupled another host, such as a mother board or other PCB, by second level interconnects (SLI) 720. SLI 720 may comprise any solder (ball, bump, etc.) suitable for a given host board architecture (e.g., surface mount FR4, etc.). As illustrated in dashed line, one or more heat spreaders and/or heat sinks 750 may be further coupled to backside of IC die 201, which may be advantageous, for example, where IC die 201 comprises one or more CPU cores.

Although FIG. 2-9 illustrate exemplary face-to-face bonding embodiments of methods 100, methods 100 may also be practiced to form at other composite IC die package architectures. As noted above, a lower-level IC die may be bonded with an upper-level IC die in other than a face-to-face configuration. FIG. 8A and 8B, for example, illustrate cross-sectional views of hybrid bonding lower-level IC die and an ETMD into a composite IC die package 801, in accordance with some alternative back-to-face embodiments. As shown in FIG. 8A, IC die 203 and 204 are both inverted relative to their orientation in FIG. 2. Each of the lower-level IC die 203, 204 therefore include bondable conductive features 230 on die backside 205 and interconnect interfaces 240 suitable for interfacing with a FLI feature are on IC die front side 221. In this example, TSVs 235 again interconnect front-side interconnect interfaces 240 with backside features 230. However, in other embodiments IC die 203 and/or 204 may lack any TSVs, in which case all of the IC die may be reliant upon power and/or signals convey through ETMD 202.

Following IC die alignment and hybrid bonding, IC die package 801 may be processed substantially as described above, for example with package insulator 505 filling in spaces between lower-level IC die. Although both lower-level IC dies 203, 204 are bonded back-to-face with IC die 201, one subset of lower-level IC die may be bonded back-to-face while another subset is bond face-to-face. Although ETMD 202 is again bonded face-to-face with IC die 201, ETMD 202 may be similarly bonded back-to-face.

Figure 9:
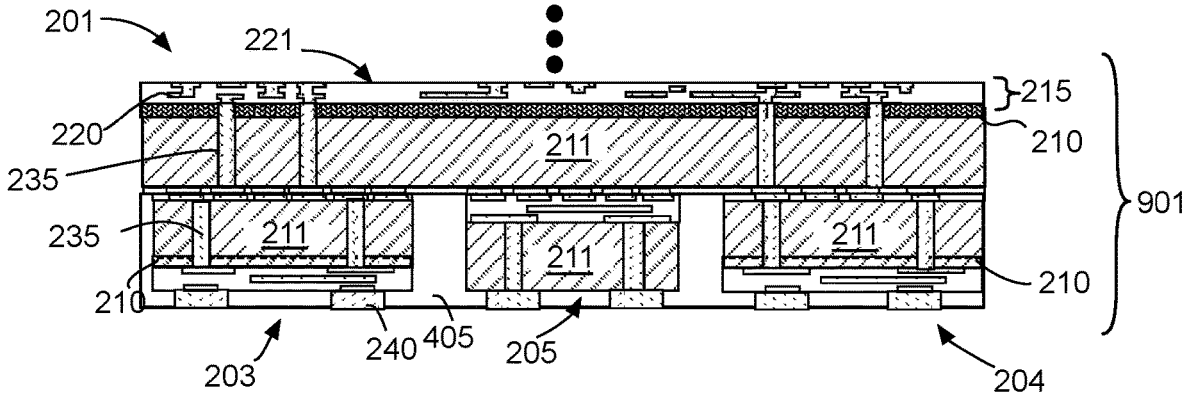
FIG. 9 illustrates a cross-sectional view of hybrid bonding active IC die and ETMD into a composite IC die package, in accordance with some alternative embodiments.

In still other embodiments, the upper-level IC die of a composite IC die package may also include TSVs, allowing the upper-level IC die to be inverted from the orientation illustrated in FIG. 2-8B. FIG. 9 illustrates a cross-sectional view of active IC die and an ETMD into a composite IC die package 901, in accordance with some alternative embodiments. In this example, upper-level IC die 201 includes TSVs 235, which may be substantially as described above for lower-level IC die 203 and 204. IC die 201 also includes bondable features on the backside of substrate 211, which are directly bonded to those on the backside of lower-level IC die 203, 204. In this back-to-back configuration, upper-level IC die 201 has a front side 221 available for bonding of additional IC die, for example in a face-to-face or face-to-back configuration. As represented by ellipses in FIG. 9, one or more die may be stacked over IC die 201. For example, another IC die 201 may be bonded, or another set of IC die 203 and 204 may be bonded into the composite IC die package 901. For some embodiments, another ETMD may be bonded over IC die 201, for example to convey electrical power and/or signals from upper-level IC die 201 to a next higher level of IC die. The ellipses in FIG. 9 may therefore represent a mirror image of ETMD 202 and lower-level IC die 203, 204. One or more additional IC die may then be bonded over this second instance of ETMD 202 and lower-level IC die 203, 204.

Figure 10:
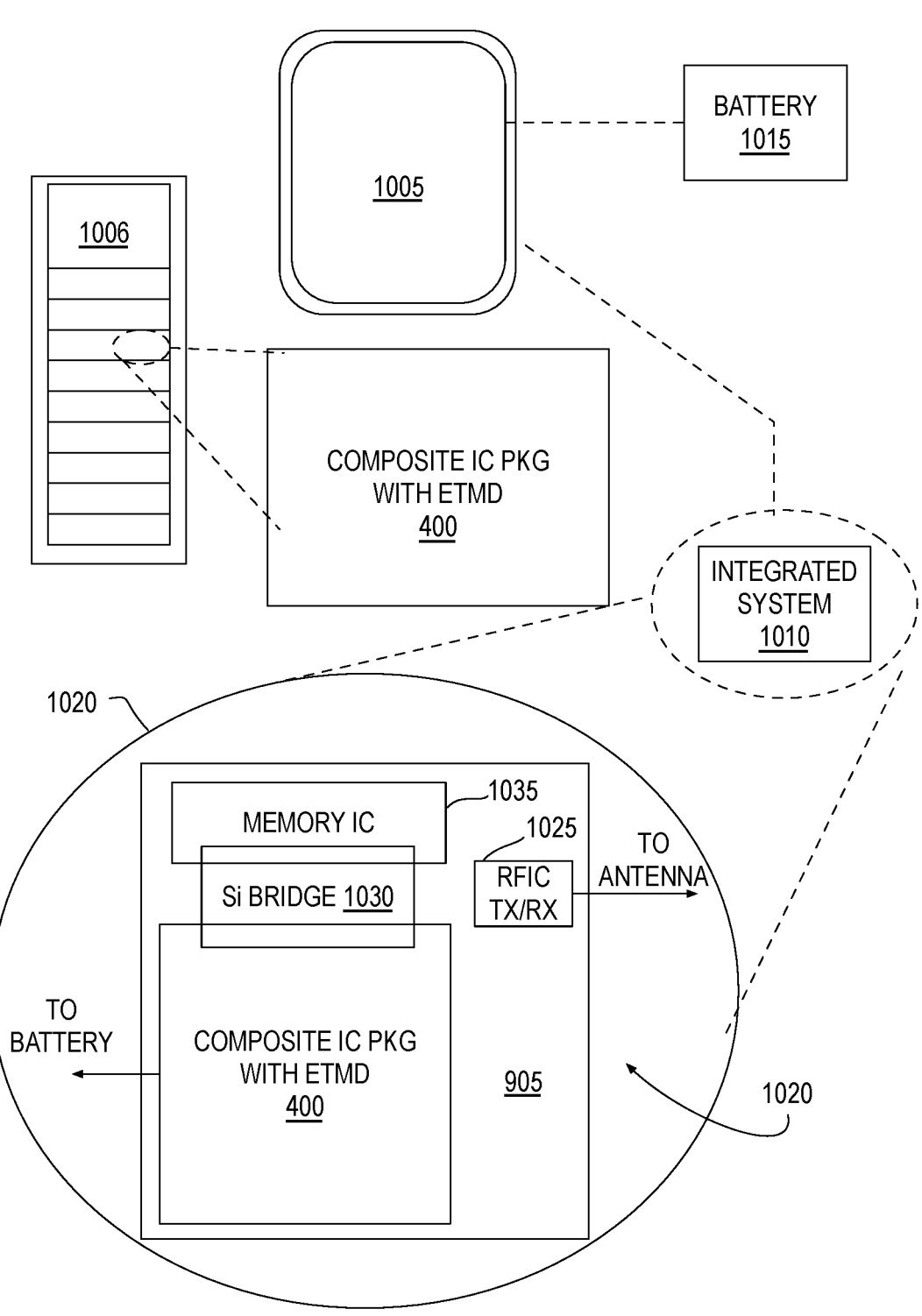
FIG. 10 illustrates a mobile computing platform and a data server machine employing a composite IC die package, in accordance with some embodiments.

FIG. 10 illustrates a mobile computing platform 1005 and a data server machine 1006 employing a composite IC die package including an ETMD, for example as described elsewhere herein. Server machine 1006 may be any commercial server, for example including any number of high-performance computing platforms disposed within a rack and networked together for electronic data processing, which in the exemplary embodiment includes a double-side composite package 400 that includes an ETMD, for example as described elsewhere herein. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), an integrated system 1010, and a battery 1015.

As illustrated in the expanded view 1020, double-sided composite package 400 is further coupled to host component 905, along with one or more memory IC 1035. Memory IC 1035 is interconnected to composite package 400 through a silicon bridge 1030. One or more of a power management integrated circuit (PMIC) 1030 or RF (wireless) integrated circuit (RFIC) 1025 including a wideband RF (wireless) transmitter and/or receiver may be further coupled to host component 905. PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, and beyond.

Figure 11:
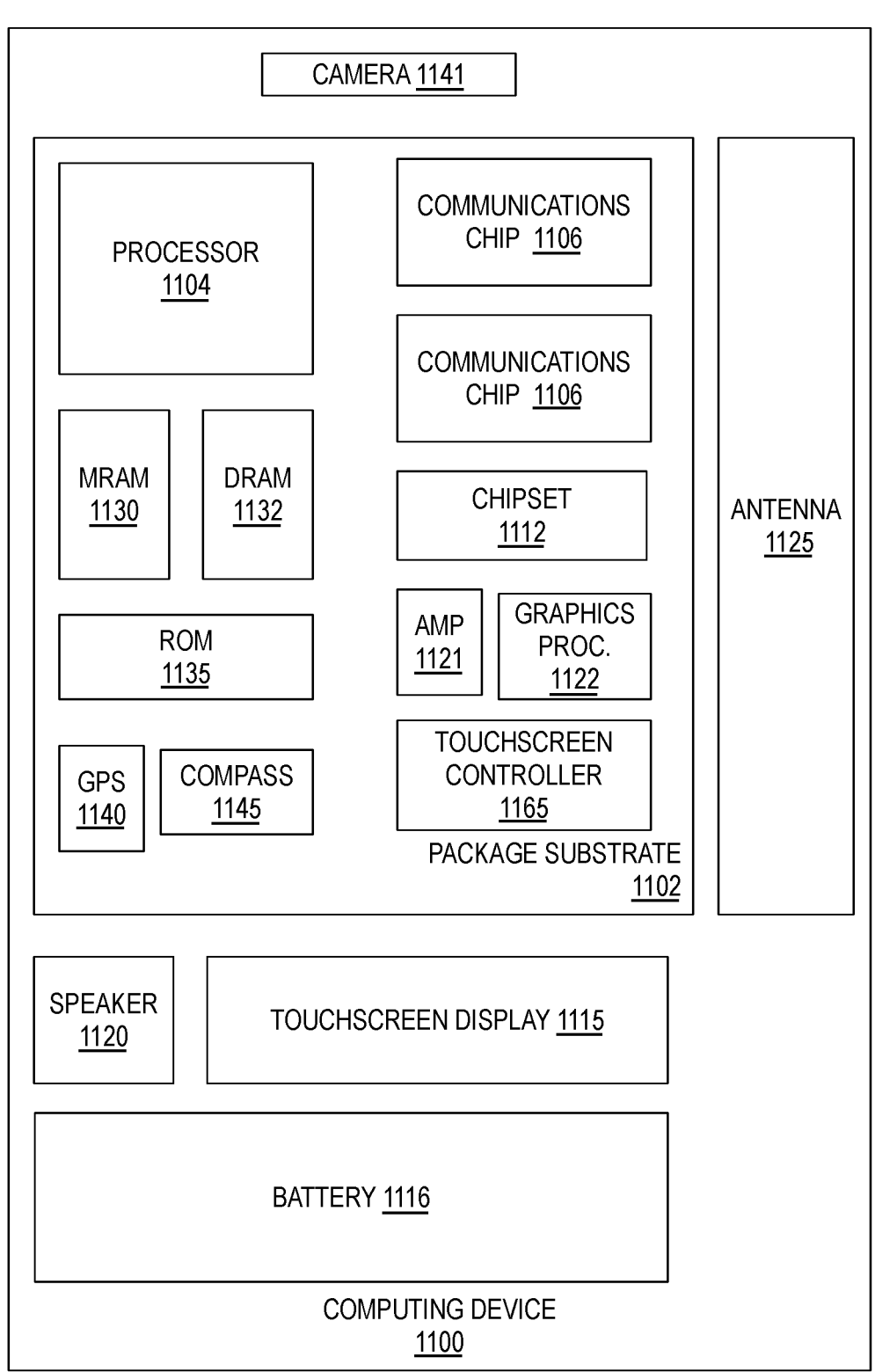
FIG. 11 is a functional block diagram of an electronic computing device, in accordance with some embodiments.

FIG. 11 is a functional block diagram of an electronic computing device 1100, in accordance with an embodiment of the present invention. Computing device 1100 may be found inside either mobile computing platform 1005 or server machine 1006, for example. Device 1100 further includes a motherboard 1102 hosting a number of components, such as, but not limited to, a processor 1104 (e.g., an applications processor). Processor 1104 may be physically and/or electrically coupled to motherboard 1102. In some examples, processor 1104 is within a composite IC die package including an ETMD, for example as described elsewhere herein. Processor 1104 may be implemented with circuitry in any or all of the IC die of the composite IC die package. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM 1132), non-volatile memory (e.g., ROM 1135), flash memory (e.g., NAND or NOR), magnetic memory (MRAM 1130), a graphics processor 1122, a digital signal processor, a crypto processor, a chipset 1112, an antenna 1125, touchscreen display 1115, touchscreen controller 1165, battery 1116, audio codec, video codec, power amplifier 1121, global positioning system (GPS) device 1140, compass 1145, accelerometer, gyroscope, speaker 1120, camera 1141, and mass storage device (such as hard disk drive, solid-state drive (SSD), compact disk (CD), digital versatile disk (DVD), and so forth), or the like. In some exemplary embodiments, at least two of the functional blocks noted above are within a composite IC die package structure including an ETMD, for example as described elsewhere herein. For example, processor 1104 be implemented with circuitry in an upper-level IC die, and an electronic memory (e.g., MRAM 1130 or DRAM 1132) may be implemented with circuitry in a lower-level IC die bonded to the upper-level IC die. An ETMD adjacent to the electronic memory die may convey electrical power and/or electrical signals to the processor 1104.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) die package comprises a first IC die, and a passive die directly bonded to a first portion of a first side of the first IC die. The passive die lacks a device layer, but comprises routing metallization on a first side and one or more through vias extending to corresponding interconnect interfaces on a second side of the passive die. The IC die package further comprises a second IC die adjacent to the passive die and directly bonded to a second portion of the first side of the first IC die.

In seond examples, for any of the first examples the second IC die comprises through vias coupled to corresponding second interconnect interfaces on a second side of the second IC die, and the interconnect interfaces are substantially co-planar with the second interconnect interfaces.

In third examples, for any of the first through third examples the IC package further comprising an inorganic dielectric in contact with a third portion of the first side of the first IC die, the third portion between the first and second portions.

In fourth examples, for any of the third examples the inorganic dielectric comprises a compound comprising nitrogen.

In fifth examples, for any of the first through fourth examples the IC package further comprises a package insulator material substantially filling a space between the passive die and the second IC die.

In sixth examples, a system comprises a host component, and an integrated circuit (IC) die package. The IC die package comprises a first IC die, and a passive die directly bonded to a first portion of a first side of the first IC die, wherein the passive die lacks a device layer but comprises routing metallization on a first side and one or more through vias extending to corresponding interconnect interfaces on a second side of the passive die. The IC die package further comprises a second IC die adjacent to the passive die and directly bonded to a second portion of the first side of the first IC die. The second IC die comprises through vias coupled to corresponding second interconnect interfaces on a second side of the second IC die. The system comprises solder features interconnecting host component to the interconnect interfaces and the second interconnect interfaces.

In seventh examples, for any of the sixth examples the system comprises a power supply coupled to the host component to send power through the passive die.

In eighth examples, for any of the sixth through seventh examples the first IC die is a first of a microprocessor core circuitry, wireless radio circuitry, floating point gate array (FPGA) circuitry, power management circuitry, active repeater circuitry, clock generator circuitry, memory circuitry, or input/output buffer circuitry. The second IC die is a second of a microprocessor core circuitry, wireless radio circuitry, floating point gate array (FPGA) circuitry, power management circuitry, active repeater circuitry, clock generator circuitry, memory circuitry, or input/output buffer circuitry.

In ninth examples, a method of assembling an integrated circuit (IC) package comprises receiving a passive die with routing metallization on a first side of the passive die and one or more through vias extending to corresponding interconnect interfaces on a second side of the passive die. The method comprises directly bonding the first side of the passive die to a first portion of a first side of a first IC die, directly bonding a first side of a second IC die to a second portion of the first side of the first IC die.

In tenth examples, for any of the ninth examples the second IC die comprises through vias coupled to corresponding second interconnect interfaces on a second side of the second IC die. Directly bonding the passive die and the second IC die to the first IC die positions the interconnect interfaces substantially co-planar with the second interconnect interfaces.

In eleventh examples, for any of the tenth examples the method further comprises depositing an inorganic dielectric in contact with a third portion of the first side of the first IC die, the third portion between the first and second portions.

In twelfth examples, for any of the eleventh examples depositing the inorganic dielectric comprises depositing a compound comprising nitrogen.

In thirteenth examples, for any of the ninth through twelfth examples the method comprises substantially filling a space between the passive die and the second active IC die with a package insulator material.

In fourteenth examples, for any of the thirteenth examples substantially filling the space comprises molding an organic dielectric around the passive die and the second active IC die.

In fifteenth examples, for any of the thirteenth through fourteenth examples the method further comprises performing a planarization process to remove the package insulator material and expose both the interconnect interfaces and the second interconnect interfaces.

In sixteenth examples, for any of the tenth through fifteenth examples, the method comprises depositing interconnect features on both the interconnect interfaces and on the second interconnect interfaces.

In seventeenth examples, for any of the ninth through sixteenth examples the method comprises attaching the interconnect features to a host component by reflowing the interconnect features.

In eighteenth examples, for any of the ninth through seventeenth examples directly bonding the first side of the passive die to the first portion of the first side of the first IC die comprises forming a hybrid bond between first metal features embedded within a first dielectric material on the first IC die and second metal features embedded within a second dielectric material on the passive die.

In nineteenth examples, for any of the eighteenth examples the first dielectric material that is around the first metal features is in direct contact with the second dielectric material that is around the second metal features, and wherein an interdiffused metallurgical bond joins the first metal features to the second metal features.

In twentieth examples, for any of the eighteenth through nineteenth examples directly bonding the first side of the second IC die to a second portion of the first side of first IC die comprises forming a hybrid bond between third metal features embedded within a third dielectric material on the second IC die, and the first metal features embedded within the first dielectric material on the first IC die.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) die package comprising:
a first IC die;
a passive die directly bonded to a first portion of a first side of the first IC die, wherein the passive die lacks a device layer, but comprises routing metallization on a first side and one or more through vias extending to corresponding interconnect interfaces on a second side of the passive die; and
a second IC die adjacent to the passive die and directly bonded to a second portion of the first side of the first IC die.

2. The IC die package of claim 1, wherein the second IC die comprises through vias coupled to corresponding second interconnect interfaces on a second side of the second IC die, and wherein the interconnect interfaces are co-planar with the second interconnect interfaces.

3. The IC die package of claim 1, further comprising an inorganic dielectric in contact with a third portion of the first side of the first IC die, the third portion between the first and second portions.

4. The IC die package of claim 3, wherein the inorganic dielectric comprises a compound comprising nitrogen.

5. The IC die package of claim 1, further comprising a package insulator material substantially filling a space between the passive die and the second IC die.

6. A system comprising:
a host component;
an integrated circuit (IC) die package comprising:
a first IC die with first interconnect interfaces on a first side of the first IC die;
a passive die directly bonded to a first portion of the first side of the first IC die, wherein the passive die lacks a device layer, but comprises routing metallization coupled to second interconnect interfaces on a first side of the passive die, and one or more through vias extending from the routing metallization to corresponding third interconnect interfaces on a second side of the passive die, wherein the second interconnect interfaces are in direct contact with first ones of the first interconnect interfaces; and a second IC die adjacent to the passive die and directly bonded to a second portion of the first side of the first IC die, wherein the second IC die comprises fourth interconnect interfaces on a first side of the second IC die and in direct contact with second ones of the first interconnect interfaces, and wherein the second IC die comprises through vias extending to fifth interconnect interfaces on a second side of the second IC die; and solder features, wherein a first ones of the solder features are in contact with a first portion of the host component and in contact with the third interconnect interfaces, and wherein second ones of the solder features are in contact with a second portion of the host component and in contact with the fifth interconnect interfaces.

7. The system of claim 6, further comprising:

a power supply coupled to the host component to send power through the passive die.

8. The system of claim 6, wherein:

the first IC die is a first of a microprocessor core circuitry, wireless radio circuitry, floating point gate array (FPGA) circuitry, power management circuitry, active repeater circuitry, clock generator circuitry, memory circuitry, or input/output buffer circuitry; and the second IC die is a second of a microprocessor core circuitry, wireless radio circuitry, floating point gate array (FPGA) circuitry, power management circuitry, active repeater circuitry, clock generator circuitry, memory circuitry, or input/output buffer circuitry.

9. The IC die package of claim 1, wherein:

the first IC die comprises first interconnect interfaces on a first side of the first IC die;

the passive die comprises second interconnect interfaces on the first side of the passive die, and in direct contact with first ones of the first interconnect interfaces;

the passive die comprises third interconnect interfaces on the second side of the passive die;

the second IC die comprises fourth interconnect interfaces on a first side of the second IC die and in direct contact with second ones of the first interconnect interfaces; and the second IC die comprises fifth interconnect interfaces on the second side of the second IC die.

10. The IC die package of claim 9, further comprising:

first solder features in contact with the third interconnect interfaces; and second solder features in contact with the fifth interconnect interfaces.

11. The IC die package of claim 10, further comprising a single host component, wherein a first portion of the host component is in contact with the first solder features and a second portion of the host component is in contact with the second solder features.

12. The IC die package of claim 9, wherein the first ones of the first interconnect interfaces are metallurgically interdiffused with the second interconnect interfaces and wherein the second ones of the first interconnect interfaces are metallurgically interdiffused with the fourth interconnect interfaces.

13. The IC die package of claim 3, wherein the inorganic dielectric is a conformal layer comprising nitrogen and silicon, and further comprising an organic material within topography traversed by the conformal layer of inorganic dielectric.

14. The IC die package of claim 13, wherein the organic material is an epoxy with one or more filler.

15. The IC die package of claim 9, wherein the third and fifth interconnect interfaces are coplanar.

16. The IC die package of claim 1, wherein both the IC die and the passive die comprise a substrate material, the substrate material is silicon, the through vias of the IC die extend through the silicon substrate material of the IC die, and the through vias of the passive die extend through the silicon substrate material of the passive die.

* * * * *